United States Patent [19]

Borth

[11] Patent Number: 4,775,851

[45] Date of Patent: Oct. 4, 1988

[54] MULTIPLIERLESS DECIMATING LOW-PASS FILTER FOR A NOISE-SHAPING A/D CONVERTER

[75] Inventor: David E. Borth, Palatine, Ill.

[73] Assignee: Motorola, Inc., Schaumburg, Ill.

[21] Appl. No.: 57,200

[22] Filed: Jun. 1, 1987

[51] Int. Cl.[4] .............................................. H03M 1/12
[52] U.S. Cl. ............................ 341/155; 340/347 DD; 364/724
[58] Field of Search ................ 340/347 DA, 347 DD; 364/724

[56] References Cited

U.S. PATENT DOCUMENTS 4,435,823  3/1984  Davis et al. ........................ 364/724
4,558,454  12/1985  Hills et al. ......................... 364/724

OTHER PUBLICATIONS

J. C. Candy, "A Use of Double Integration in Sigma/-Delta Modulation", *IEEE Transactions on Communications*, vol. COM-33, No. 3, Mar. 1985, pp. 249-258.

Candy et al., "Using Triangularly Weighted Interpolation to Get 13-Bit PCM from a Sigma-Delta Modulator", *IEEE Transactions on Communication*, Nov. 1976, pp. 1268-1275.

J. D. Everard, "A Single-Channel PCM Codec", *IEEE Transactions on Communications*, vol. COM-27, No. 2, Feb. 1979, pp. 283-295.

B. M. Gordon, "Linear Electronic Analog-Digital Conversion Architectures, Their Origins Parameters, Limitations, and Applications," *IEEE Transactions on Circuits and Systems*, vol. CAS-25, No. 7, Jul. 1978, pp. 391-418.

ITT Semiconductors ADC2300U and APU2400U Digital Sound Channel IC Kit Specification Sheet, Number 6251-241-2E, Oct. 1985, pp. 1-24.

Kathern H. Lambert and Lester A. Longley, "Improved Decimating FIR Filter", *Motorola Technical Developments*, vol. 5, pp. 39-40.

A. V. Oppenheim and R. W. Schafer, *Digital Signal Processing*, New Jersey: Prentice-Hall, 1975, pp. 237-268.

A. Peled and B. Liu, *Digital Signal Processing*, New York: John Wiley, 1976, pp. 80-81.

R. Steele, *Delta Modulation Systems*, New York: John Wiley, 1975, pp. 17-20.

S. K. Tewksbury, "Oversampled, Linear Predictive and Noise-Shaping Coder of Order N>1", *IEEE Transactions on Circuits and Systems*, vol. CAS-25, No. 7, Jul. 1978, pp. 436-447.

Frederick A. Williams, "An Expandable Single-IC Digital Filter/Correlator", 1982 *IEEE International Conference on Acoustics, Speech, and Signal Processing*, pp. 1077-1080.

Zohar Raz and David E. Borth, "Digital MIS System", *IEEE International Conference on Consumer Electronics*, (June 4, 1986), pp. 98-99.

*Primary Examiner*—William M. Shoop, Jr.
*Assistant Examiner*—Richard K. Blum
*Attorney, Agent, or Firm*—Douglas A. Boehm; Charles L. Warren; Steven G. Parmelee

[57] ABSTRACT

A method and means for filtering the quantization noise from the output of a 1-bit analog-to-digital converter (noise-shaping coder) is disclosed. The A/D utilizes oversampling of the analog input signal, and decimation of the digital output signal. The multiplierless low-pass filter is comprised of a coefficient ROM for storing the filter coefficients, a counter for addressing the memory, and a true/complement gate for selectively complementing the output of the memory in response to the 1-bit data stream from the noise-shaping coder. An accumulator sums the selectively complemented output words for all samples, and the accumulated output is then applied to the decimator. A second embodiment is also disclosed which utilizes an overlapping digital filter approach, wherein a plurality of digital multiplierless filters are overlapped to provide an arbitrary length filter capable of producing an arbitrary filter response.

22 Claims, 2 Drawing Sheets

MULTIPLIERLESS DECIMATING LOW-PASS FILTER FOR A NOISE-SHAPING A/D CONVERTER

BACKGROUND OF THE INVENTION

1. Field of the Invention

The present invention generally relates to analog-to-digital (A/D) conversion techniques. More particularly, the present invention pertains to the digital implementation of a finite-impulse-response (FIR) low-pass filter to suppress the out-of-band quantization noise from a particular class of A/D converters known as noise-shaping coders.

2. Description of the Prior Art

Before any analog signal can be processed through digital means, a translation of the analog signal to a sampled-time quantized digital representation must be performed. Such a translation is normally accomplished utilizing an analog-to-digital (A/D) converter. Functionally, a linear A/D converter is a device that accepts an analog voltage at its input terminals and yields a set of digitally-coded outputs whose magnitude is proportional to the input voltage. Numerous A/D converter techniques are known in the art. A summary of some of the more widely known A/D conversion techniques is given in B.M. Gordon, "Linear Electronic Analog-Digital Conversion Architectures, Their Origins, Parameters, Limitations, and Applications," *IEEE Transactions on Circuits and Systems,* Vol. CAS-25, No. 7, July 1978, pp. 391–418.

Digital processing of audio and video signals necessitates the use of an A/D converter capable of high sampling rates (8 kHz–500 kHz) and high resolution (in excess of 10 bits). This combination of requirements rules out many A/D conversion techniques, including those frequently employed in integrated circuits (ICs). One conversion method that does meet both the sampling rate and resolution requirements, while being compatible with existing IC processes, is a class of A/D converter techniques known as noise-shaping coders.

A noise-shaping coder is an A/D converter which allows the use of a fewer number of quantizer levels as compared to a standard flash-type A/D converter. The term "noise-shaping" originates from the observation that placing a quantizer in a feedback loop with a filter shapes the spectrum of the modulation noise. Noise-shaping coders typically incorporate oversampling of the input signal, employing a feedback network to shape the in-band quantization noise, low-pass filtering the out-of-band quantization noise, and decimating the output at a rate equal to the oversampling rate Oversampling and decimation is often used to avoid high-speed digital signal processing in stages subsequent to the A/D. An example of a 1-bit quantizer noise-shaping coder is a sigma-delta modulator (SDM), as described in detail by R. Steele, Delta Modulation Systems, New York: John Wiley, 1975, pp. 17–20.

It is well known that simple oversampling, as applied to a multi-level quantizer, suppresses the quantization noise by a suppression factor S of:

$$S(dB) = 10 \log_{10} N$$

where N, the oversampling factor, is equal to the ratio of the sampling frequency to the Nyquist sampling frequency of the signal. Thus, a signal must be oversampled by a factor of N=4 in order to gain one additional bit (6 dB) of resolution. By employing a noise-shaping feedback path in the quantizer along with this oversampling technique, the quantization noise floor for frequencies less than one-half the Nyquist sampling frequency can be suppressed by a factor:

$$S(dB) = 10 (2K+1) \log_{10} N$$

where K is the order of the noise-shaping network. (See S. K. Tewksbury, "Oversampled, Linear Predictive and Noise-Shaping Coders of Order N>1", *IEEE Transactions on Circuits and Systems,* Vol. CAS-25, No. 7, July 1978, pp. 436–447, for analysis of equations.) Hence, a fairly simple noise-shaping network, i.e., K=1 or 2, yields a significant improvement in the in-band noise performance of the A/D converter. Furthermore, by choosing K=2 and N=100, a 1-bit quantizer can achieve 12 bits of resolution and still be readily implemented in silicon.

The noise-shaping coder introduces frequency weighting of the quantized noise power spectral density, as seen by the following equation for the spectral density for a first order Sigma-Delta modulator:

$$N(f) = \sigma \sqrt{\frac{2\tau}{3}} \sin(\pi f \tau)$$

where $\sigma$ is the quantization step size and $\tau$ is the sampling period. The quantization noise N(f) is suppressed the most at low frequencies where the loop gain of the feedback path is the highest. This reduction of in-band low frequency noise is accompanied by an increase in out-of-band high frequency noise. In order to achieve the aforementioned improvements in resolution, it is necessary to adequately suppress the out-of-band quantization noise prior to decimation. A low-pass filter with a very sharp cut-off must be utilized at the output of the quantizer to prevent the quantization noise from aliasing back into the signal band.

Digital finite-impulse-response (FIR) filters are well-suited for implementation in integrated circuitry. The conventional high-speed/high-order (non-decimating) FIR filter comprises a tapped delay line, a means for weighting the outputs of those taps (such as a multiplier), and a means for summing all the delayed and weighted signal samples (such as an accumulator). For an L-tap filter, L cascaded multiplier-accumulators (MACs) are generally required. This approach is most reasonable when the sampling rate fS is much less than the MAC maximum operating range.

The implementation of such an FIR filter presents several drawbacks. First, the use of multipliers places an upper limit on the operating speed of the A/D converter. To achieve speeds compatible with audio and video signals, the use of full multiply/accumulate functions in a 384 tap FIR low-pass filter would require digital signal processing (DSP) speeds in excess of 12.2 GHz for sampling rates of 32 MHz, which is presently not practical with today's DSP technology.

Secondly, in order to achieve the resolution necessary for high quality video signals, an FIR filter must have a large number of filter taps, e.g., 384 filter taps. Such a number of MACs becomes prohibitively large and expensive to implement in ICs. For example, the implementation of a 384-tap video-speed FIR filter becomes a formidable task in terms of the integration size/expense/resolution trade-off.

Third, as mentioned above, the out-of-band quantization noise power can be reduced by using a lowpass filter having a sharp cutoff response. Again, there is a significant design trade-off between digital filter complexity and signal-to-quantization noise ratio (SQNR) performance.

A need, therefore, exists to provide a high-speed, high resolution, low noise, digital filtering technique which remains compatible with present integrated circuit size and cost goals.

SUMMARY OF THE INVENTION

Accordingly, a general object of the present invention is to provide an improved analog-to-digital converter having high resolution, high speed, and a high SQNR.

Another object of the present invention is to provide an improved digital filter for a noise-shaping coder without the use of multipliers.

A further object of the present invention is to provide a multiplierless decimating FIR low-pass filter having an increased filter length and an arbitrary filter response.

These and other objects are achieved by the present invention which, briefly described, is a digital filter for filtering the output code from a 1-bit analog-to-digital converter having means for oversampling an analog input signal at a rate $N*f_S$, wherein $f_S$ is the sampling frequency, and having means for decimating the filtered output by N to provide a digital output signal at a rate $f_S$, the digital filter comprising: a memory for storing N predetermined filter coefficient words; a counter for addressing the memory such that one of the N predetermined filter coefficient words is output from the memory at a rate of $N*f_S$; a gate for selectively complementing the output word of the memory in response to the 1-bit output code from the analog-to-digital converter; and an accumulator for summing the selectively complemented output words for N samples to provide a digital output signal at a rate $N*f_S$. Such a digital filter can be used for any application exhibiting a 1-bit data stream at a high data rate.

An alternate embodiment of the present invention is an analog-to-digital converter utilizing a plurality P of overlapping digital filters of the kind just described. The A/D converter includes means for oversampling an analog input signal at a rate $N*f_S$, wherein $f_S$ is the sampling frequency, means for converting the sampled analog signal into a 1-bit digital code, and means for filtering the quantization noise from the 1-bit digital code, the filtering means comprising: an offset generator for generating a plurality P of counter offset values, each having a value $N*(i-1)$, where $i=1$ to P; a plurality P memories for storing $P*N$ predetermined filter coefficient words; a plurality P of modulus P counters for addressing the P memories in response to the appropriate counter offset signal such that one of the $P*N$ predetermined filter coefficient words is output from each of the memories at a rate of $N*f_S$; a plurality P of true/complement gates for selectively complementing the output word of the P memories in response to the 1-bit code; a plurality P of accumulators for summing the selectively complemented output words for $P*N$ samples; a plurality P of decimators for dividing the accumulated output words by N to provide P digital output words at a rate $f_S$; and a multiplexer for selecting one of the plurality P of decimated output words to provide a digital output signal at a rate $f_S$. This overlapping, multiplierless, low-pass filter approach provides an arbitrary length filter capable of producing an arbitrary filter response.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like-referenced numerals identify like elements, and in which:

DETAILED DESCRIPTION OF THE PREFERRED EMBODIMENT

Figure 1:
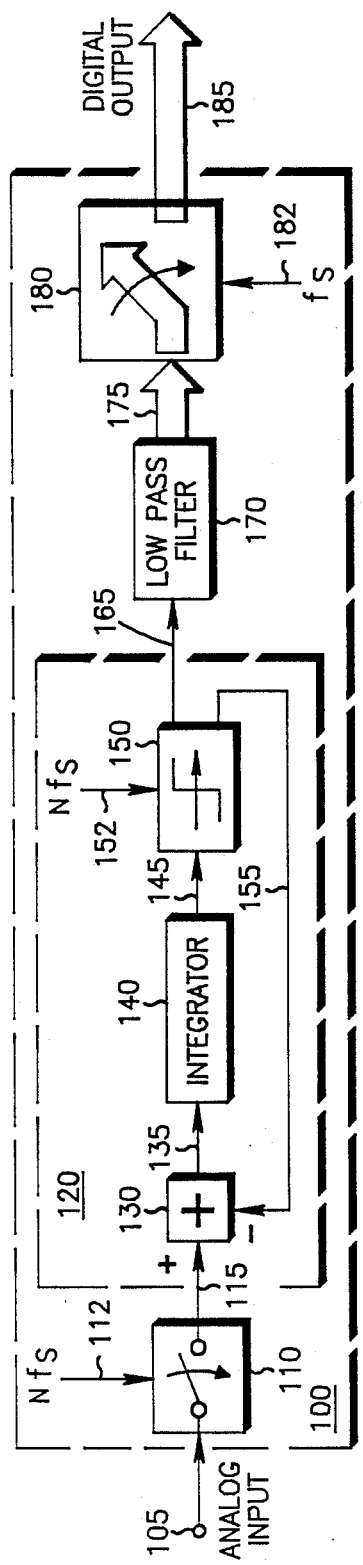
FIG. 1 is an embodiment of an analog-to-digital converter incorporating the low-pass filter of the present invention.

FIG. 1 illustrates analog-to-digital converter 100 as a general block diagram. The A/D converter is essentially comprised of oversampling network 110, noise-shaping coder network 120, low-pass filter network 170, and decimating network 180.

An analog input signal x(t) is applied to input terminal 105 of A/D converter 100. The analog signal is oversampled via oversampling network 110 at a rate $N*f_S$, where N, the oversampling factor, is equal to the ratio of the sampling frequency $f_S$ to the Nyquist sampling frequency of the signal. An oversampling clock signal $N*f_S$ is applied to oversampling network 110 via clock line 112, as known in the art. (Refer to A. Peled and B. Liu, *Digital Signal Processing*, New York: John Wiley, 1976, pp. 80-81, for oversampling analysis.) Hence, the analog input signal x(t) at 110 is transformed into a time-sampled signal X(T) at 115, wherein $T=1/N*f_S$, and wherein $t=1/f_S$.

Noise-shaping coder network 120, providing a onebit quantized output signal at 165, may be classified as a Sigma-Delta modulator. Summing block 130 subtracts the quantized feedback signal Q(T) at 155 from the oversampled, non-quantized input signal X(T) at 115, to provide an error signal $E(T)=X(T)-Q(T)$ at 135, which is applied to integrator 140. These error signals accumulate in the integrator so as to minimize the average value of the quantization error. Hence, the integrated error $$\int_O^T (X - Q)dT = E(i)$$

at 145 includes the noise from the input signal value X(T) plus the accumulated modulation noise from all past cycles. The noise-shaping coder tries to minimize this noise by having the quantized values oscillate between levels in such a way that the average of the feedback signal Q(T) approximates the average of the input signal X(T). Hence, integrator 140 serves the function of a loop filter having a transfer function $H(\omega)$.

Quantizer network 150 acts as a threshold detector and serves to convert the analog time-sampled integrated error signal E(i) into a 1-bit digital (binary) quantized output X(i) at 165. Quantizer 150 utilizes an oversampling clock signal $N^*f_S$ input at 152 to perform this function. The values that quantizer output 165 can take are constrained simply to $+V$ or $-V$ where V is equal in magnitude to the maximum value of X(T). If the interval is positive, $+V$ is used to create a negative difference which drives the interval toward zero. If the interval is negative, $-V$ is used to create a positive difference which again drives the interval toward zero. The feedback loop causes the interval to oscillate about zero keeping the output within restricted bounds. Hence the loop causes the average value of X(i) to track the average value of X(T). The difference between these signals results in a small level of in-band quantization noise due to the coding process. (Refer to J. D. Everard, "A Single-Channel PCM Codec", *IEEE Transactions on Communications,* Vol. COM-27, No. 2, February 1979, pp. 283-295 for a theoretical analysis.)

Low-pass filter network 170, providing an M-bit filtered output signal Y(j) at 175, serves to suppress the out-of-band quantization noise of the quantized output signal X(i) 165 prior to decimation. Low-pass filter 170 may be implemented as a passive or active analog filter, or an FIR (finite-impulse-response) or IIR (infinite-impulse-response) digital filter. However, some of the performance constraints which may dictate the implementation include a very sharp cut-off response, high speed operation, and ease of integration (in existing IC processes).

Decimator network 180 is used to lower the sampling rate of the signal Y(j), available at low-pass filter output 175, by the oversampling factor (decimation factor) N, to provide an M-bit digital output Z(j) at 185. In other words, decimator 180 essentially performs re-sampling of the Y(j) signal having a period T, to produce output signal Z(j) having a period t, so as to compliment oversampling network 110. The digital output Z(j) has a sampling rate $f_S$ corresponding to the clock signal $f_S$ applied to decimator input 182.

Figure 2:
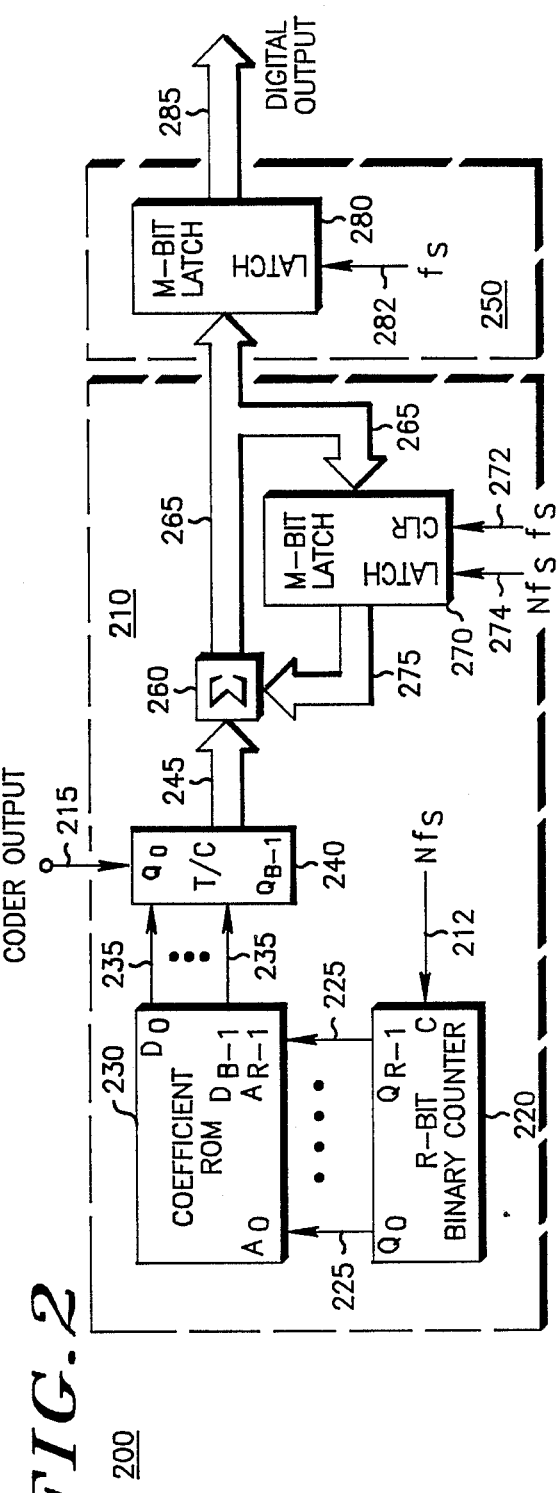
FIG. 2 is a detailed block diagram of the multiplierless decimating low-pass filter according to the present invention.

Referring now to FIG. 2, multiplierless decimating low-pass filter 200 is illustrated in accordance with the present invention. Decimating lowpass filter 200 comprises digital filter block 210 (which corresponds to low-pass filter 170 of FIG. 1), and decimator 250 (which corresponds to decimating network 180 of FIG. 1). Filter 210 is comprised of R-bit binary counter 220, $N^*B$-bit read only memory (ROM) 230 containing the filter tap coefficients, true/compliment gate 240, and M-bit accumulator including summer block 260 and latch 270. Decimator 250 is comprised solely of M-bit latch 280. In combination, blocks 210 and 250 form an FIR low-pass decimating filter.

In general, an L-stage FIR low-pass filter has an input/output relationship given by:

$$Y(j) = \sum_{i=0}^{L-1} W(j-i)^*X(i),$$

where X(i) is the filter input sequence, Y(j) is the filter output sequence, W(j−i) represents the filter tap weighting coefficients, and L is the length of the FIR filter. (See Peled, et al., pp. 77-89, for further analysis). The tap sequence W(j−i) is determined by the particular filter response requirements, and may be found using any standard FIR design technique, including windowing, frequency sampling, or optimal (Parks-McClellan) techniques. (See A.V. Oppenheim and R.W. Schafer, Digital Signal Processing, New Jersey: PrenticeHall, 1975, pp. 237-268.)

The realization of the FIR filter equation shown above requires a buffer of length L to store the L values for the input sequence X(i), and a full MAC. However, for a 1-bit noise-shaping coder operating at a sampling frequency of $N^*f_S$, X(i) is just a 1-bit sign word. The filter tap weights W(j−i) can then be applied to a true/-complement gate, instead of a full multiplier, and then fed to an accumulator. The true/complement gate may perform either a one's complement (inverting) function or a two's complement (inverting and adding one to the least significant bit) function, depending upon the desired output number representation. Thus, the multiplier may be replaced by a true/complement operation on the tap weight sequence. In addition, since decimation by N is required to derive the output word at a sample rate $f_S$, the above equation needs to be computed only once every N input samples Hence, a length L buffer is also not required to store the input sequence values.

Referring again to FIG. 2, the 1-bit word X(i) from the noise-shaping coder output is applied to filter 210 via line 215, while coefficient ROM 230 stores the N filter coefficient words W(j−i). True/complement gate 240 outputs a selectively complemented $+/-W(j-i)$ value of the B-bit data word input from ROM 230 at lines 235 via lines 245. Summing block 260, which, along with M-bit latch 270 comprises the accumulator, accumulates the N selectively complemented B-bit data words and feeds the resultant total to M-bit latch 280 for decimation.

Coefficient ROM 230 is addressed via address lines $A_0$ through $A_{R-1}$ 225, and outputs data bits $D_0$ through $D_{B-1}$ on lines 235, wherein B is the word width (in bits) of the filter coefficients, and $R=\log_2 N$. R-bit binary counter 220 outputs these address bits $Q_0$ through $Q_{R-1}$ via address lines 225. The contents of the counter step progressively from 0 to N, and then back to 0, thus addressing the N tap coefficients W(j−i) Since the input samples X(i) are arriving at once every $1/N^*f_S$ seconds, it is necessary to clock the R-bit binary address counter 220 once every $1/N^*f_S$ seconds to update the address for the next filter tap coefficient. Hence, clock signal $N^*f_S$ is applied to counter 220 via line 212.

In practice, the tap weight coefficients W(j−i) may be chosen so as to realize any arbitrary filter response, including an ideal low-pass filter for a one-bit noise-shaping coder, a filter for a 1-bit predictive coder (e.g., Delta modulation), or an anti-aliasing filter. Moreover, if the filter is designed as a linear phase filter, i.e., a filter satisfying the equation:

$$W(i) = W(L-1-i), \; 0 \leq i \leq (L-1)$$

then an R/2 up/down binary counter may be employed for counter 220, and the ROM storage requirements noted above may be reduced by one-half. (See Oppenheim, et al., for a linear-phase filter equation )

In operation, a $+1$ value on coder output 215 allows the filter weight to increment in the accumulator, while a 0 allows the filter weight to decrement in the accumulator. Every T seconds, a new value of the M-bit accumulation on bus 265 is latched onto bus 275 in accordance with the $N^*f_S$ clock signal at 274. When binary counter 220 returns to 0, the accumulating M-bit latch 270 clears, due to an $f_S$ clear signal at 272 every N samples. Hence, summer 260 and latch 270 serve to accumulate the selectively complemented filter weights.

After N input samples of the selectively complemented filter coefficients have arrived, the accumulator contents are stored in M-bit latch 280. Every t seconds, controlled by sample clock signal $f_S$ at 282, a new accumulation value is read and output as the digital output word Z(j) at 285.

It is to be noted that the whole A/D converter, including all the elements of decimating low-pass filter 200 may readily be implemented in a single integrated circuit using existing bipolar or CMOS linear processing technology. In an alternate embodiment, the filter coefficients can be calculated on the fly using a counter, adders, and registers. Depending upon the integration process used, this scheme may be more area-efficient than storing the coefficients in a ROM.

To achieve the resolution performance specified earlier, a decimating low-pass filter must exhibit a very sharp "brick-wall" response. This requirement implies the utilization of an infinite length filter. Note in FIG. 2 that the maximum length L of the FIR filter is equal to the decimation factor N. In general, if N denotes the oversampling factor and L denotes the length of the FIR filter, then the low-pass decimating filter of FIG. 2 may be used to decimate the 1-bit noise-shaping coder output data stream provided that:

$$1 \leq L \leq N.$$

As a consequence of the equation, if L is less than N, then the counter would address a ROM location containing a data word having zero value. In many instances, this constraint restricts the performance of the decimating filter (and as a consequence, the accuracy of the A/D converter), since a shorter FIR filter must be used.

Figure 3:
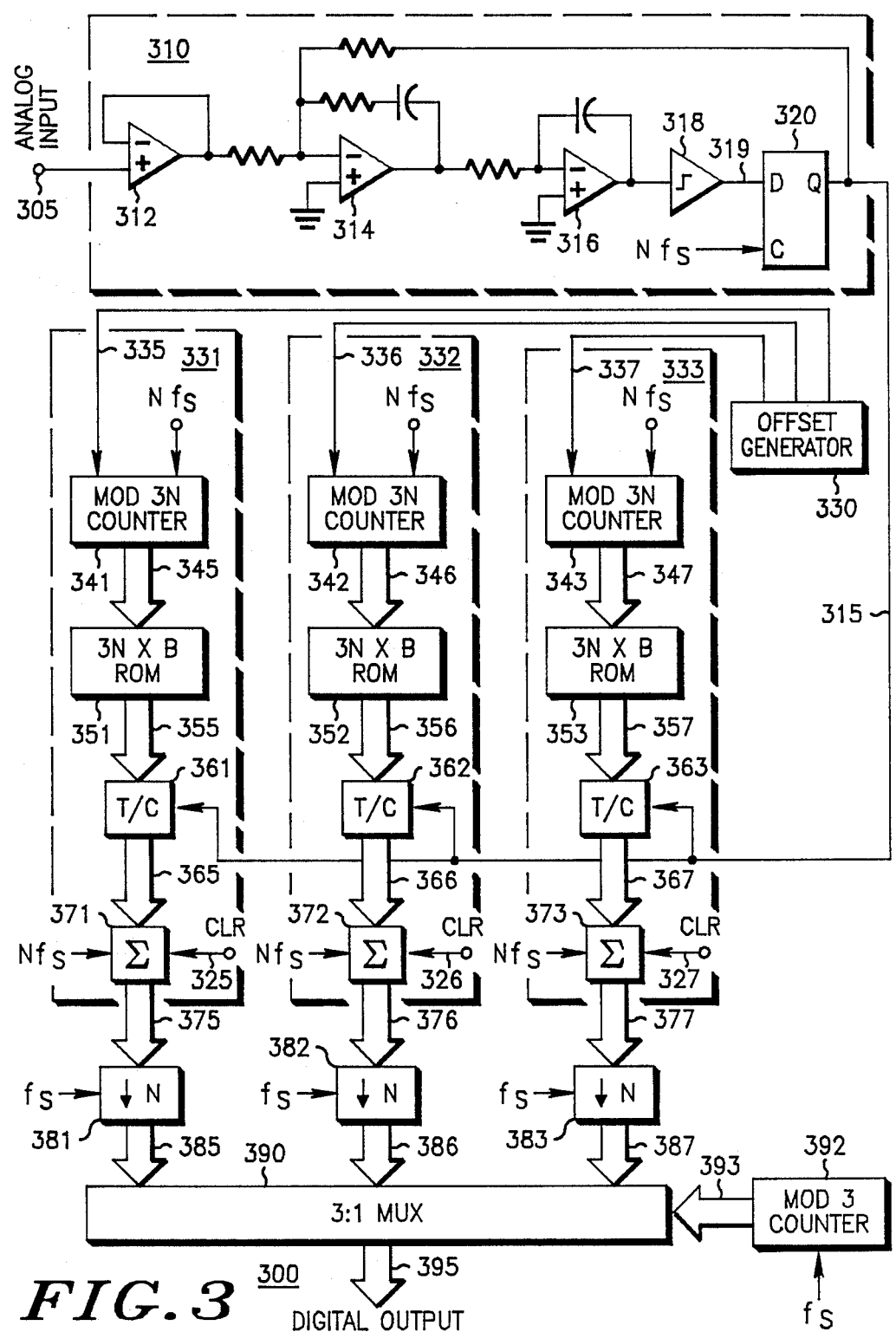
FIG. 3 is an alternate embodiment of the present invention illustrating an A/D converter employing three overlapping low-pass filters.

A solution to this problem is illustrated in FIG. 3, where a number P of "overlapping" filters are used. This approach allows the realization of an arbitrary length FIR filter, while retaining the advantage of arbitrary tap weights. P is selected so as to satisfy the requirement:

$$(P-1)*N < L \leq P*N.$$

P may range from 2 to 10 and still maintain the advantages of the present invention. For clarity of explanation, FIG. 3 will be described in terms of P=3, i.e., three overlapping filters. However, the technique of the present invention may be applied to a different number of overlapping filters, depending on the required filter response.

It can be shown that a filter which provides adequate attenuation for a second-order Sigma-Delta modulator should have a frequency response given by:

$$H(\omega) = \left[ \frac{\sin(\omega L T/2)}{\sin(\omega T/2)} \right]^3$$

(See J.C. Candy, "A Use of Double Integration in Sigma/Delta Modulation", *IEEE Transactions on Communications*, Vol. COM-33, No. 3, March 1985, pp. 249-258.) Such a frequency response may be realized with an FIR filter having a length L=3N−2. Clearly, the above constraint that the oversampling factor N must be greater than or equal to the length of the filter L prevents the use of the decimating filter structure shown in FIG. 2. However, by utilizing the overlapping filter approach shown in FIG. 3 with a plurality P=3 overlapping filters, this frequency response can be realized. The overlapping filters of FIG. 3 have an input/output relationship given by:

$$Y(j) = \sum_{i=0}^{3N-3} W(j-i)*X(i),$$

Hence, A/D converter 300 shown in FIG. 3 is a second order (K=2) Sigma-Delta modulator followed by a length L=384 FIR low-pass filter and a decimate-by-128 operation.

Filter network 310 is a double integration (K=2) modulator comprising buffer amplifier 312, first integrator 314, second integrator 316, comparator 318, and flip-flop 320. In operation, an analog input signal is applied to input port 305, buffered by amplifier 314, low-pass filtered by the second order noise-shaping network, and applied to comparator 318. The comparator, functioning as a threshold detector, provides a continuously quantized signal at 319. Flip-flop 320, in combination with its input clock $N*f_S$, serves to oversample the quantized analog signal to provide a 1-bit coder output at 315. A detailed analysis of the equation of modulator 310 is given in the aforementioned reference by J. C. Candy.

Offset generator 330 generates a plurality P of counter offset values for each of the three stages of filters. The three counter offset values on lines 335, 336, and 337, are calculated using the equation:

$$N*(i-1),$$

where i=1 to P. In other words, for P=3 overlapping filters, and a decimation factor N=128, the first offset value on line 335 would be 0, the second counter offset value at 336 would be 128, and the third counter offset value at 337 would be 256.

These counter offset values are applied to the appropriate counter for each of the three overlapping filters. Note that each of the overlapping filters 331, 332, and 333, correspond in structure and operation to the single-stage low-pass filter 210 of FIG. 2. Each of the modulus 3N counters 341, 342, and 343, which are clocked by $N*f_S$, provide an appropriately-offset addressing word, R-bits in width, to their respective ROMs via address busses 345, 346, and 347.

Coefficient ROMs 351, 352, and 353 each contain 3N filter weighting coefficients, each of B-bits in width. These filter tap coefficients are applied to their respective true/complement gates 361, 362, and 363, via ROM output busses 355, 356, and 357. Utilizing the 1-bit coder output signal 315, each of these gates selectively complements the filter coefficient word in response to the value of the 1-bit code. The selectively complemented output words are fed via busses 365, 366, and 367, respectively, to their individual accumulators 371, 372, and 373. Each accumulator sums the N output words in the same manner as the accumulator of FIG. 2. Accordingly, each accumulator utilizes locking signal $N*f_S$ and individual clear signals 325, 326, and 327, which will be described later. N accumulator output words, each of M bits in width, are fed to the individual decimators 381, 382, 383, via busses 375, 376, and 377, respectively. Again, each decimator functions in the same manner as M-bit latch 280 of FIG. 2. Every t seconds, a new decimated output word is fed to multiplexer 390. The multiplexer selects between the first, second, or third accumulator data word to produce digital output 395. Modulus 3 counter 392, which is clocked by signal $f_S$, produces a 2-bit control signal via lines 393 to the multiplexer.

The operation of the A/D converter shown in FIG. 3 will now be described.

Step 1 Initialization: All counters are reset and all accumulators are zeroed via their appropriate clear inputs.

Step 2 Start Counter No. 1: The first counter, 341, begins counting from the offset value 0, while the second and third counters 342 and 343 remain reset.

Step 3 Clock Data: N 1-bit samples of data are clocked into T/C gate 361 at a rate N*$f_S$. The 1-bit data samples are convolved with the contents of the first N locations of ROM 351. This data is accumulated in accumulator 371.

Step 4 Start Counter No. 2: After N samples of 1-bit data have been input, counter No. 2 is started from the offset value 128. Counter No. 1 continues clocking.

Step 5 Clock N More Samples: Continue clocking counters 1 and 2 and accumulating data in their appropriate accumulators.

Step 6 Start Counter No. 3: After N more samples, i.e., a total of 2N samples, counter 3 is started from an offset value of 256.

Step 7 Continue Clocking N More Samples: Continue clocking counters 1, 2 and 3 and accumulating data in their appropriate accumulators.

Step 8 Select Output: After N additional samples, i.e., 3N total samples, Mod 3 counter 392 outputs a binary 1 such that the first decimated output value, which is available at decimator line 385, is output via multiplexer 390 as the digital output 395 for an M-bit FIR filter output. The first accumulator 371 is then cleared.

Step 9 Continue Clocking: The same process of clocking N additional samples through the counter, ROM, T/C gate, and into the accumulator is followed. Similarly, the contents of successive accumulators are decimated and output through the multiplexer in a modular 3N fashion once every N input samples. Accordingly, the accumulators are then successively cleared.

Typical values for implementing the multiplierless decimating low-pass filter 200 of FIG. 2 are as follows: filter length L=128; oversampling factor N=128; number of counter address bits R=7; number of ROM data bits B=7 (for triangular tap weights); number of accumulated output bits M=14; sampling rate $f_S$=256 kHz, corresponding to t=3.9 microseconds; oversampling rate N*$f_S$=32.768 MHz, corresponding to T=3.05 nanoseconds; and maximum SQNR=60 dB.

Typical values for analog-to-digital converter 300 of FIG. 3 are as follows: filter length L=384; oversampling factor N=128; number of overlapping filters P=3; number of counter address bits R=9; number of ROM data bits B=14 (for the realization of H(w) according to the previous equation); number of accumulated output bits M=23; sampling rate $f_S$ =256 kHz, corresponding to t=3.9 microseconds; oversampling rate N*$f_S$ =32.768 MHz, corresponding to T=3.05 nanoseconds; and maximum SQNR=90 dB. Hence, since the three filters are overlapped in time, a 384-tap FIR filter output is available every 128 input samples.

In practice, the use of an up/down modulus 3N/2 counter may be used to reduce the ROM lengths to 3N/2 for a symmetric FIR filter. In addition, a single ROM may be employed to realize all of the filters via time multiplexing of the ROM's address and data busses. Furthermore, a single decimator may be used at the output. of multiplexer 390 (which would then be operating at N*$f_S$ ) instead of three separate decimators 381, 382, and 383. Still further, this overlapping filter structure may be readily implemented in existing IC processes, e.g., bipolar, CMOS, Bi-MOS.

In summary, an analog-to-digital converter is described in the form of a noise-shaping coder which consists of a double-integration Sigma-Delta modulator employing a single-bit (2 level) quantizer followed by a decimating low-pass filter. The use of a single-bit quantizer simplifies the complexity of the decimating low-pass filter, which can now be comprised of a memory for storing N predetermined filter coefficient words, a counter for addressing the memory such that one of the filter coefficient words is output every T seconds, a gate for selectively complementing the output word of the memory in response to the 1-bit output code from the Sigma-Delta modulator, and an accumulator for summing the selectively complemented output words for N samples to provide a digital output signal at a rate N*$f_S$. A longer filter may be advantageously realized by overlapping a number P digital filters of the kind just described, and multiplexing their inputs and outputs to provide a digital output signal at a rate $f_S$.

While only particular embodiments of the invention have been shown and described herein, it will be obvious that further modifications may be made without departing from the invention in its broader aspects and, accordingly, the appended claims are intended to cover all such changes and alternative constructions that fall within the true scope and spirit of the invention.

What is claimed is:

1. An analog-to-digital converter comprising:
    means for oversampling an analog input signal at a rate N*$f_S$, wherein $f_S$ is the output sampling frequency and N is the oversampling factor;
    means for quantizing the sampled analog signal into a one-bit digital code, said quantizing means producing in-band and out-of-band quantization noise;
    means for shaping the in band quantization noise via a feedback network;
    means for filtering the out-of-band quantization noise from said one-bit digital code, said filtering means including:
        means for storing N predetermined filter coefficient words;
        means for addressing said storing means at a rate corresponding to N*$f_S$;
        means for selectively complementing the addressed filter coefficient word from said storing means in response to the one-bit output code from said quantizing means; and
        means for accumulating N selectively complemented filter coefficient words to provide a filtered output code at a rate N*$f_S$; and
    said analog-to-digital converter further comprising:
        means for decimating the filtered output code by N to provide a digital output signal at a rate $f_S$.

2. The analog-to-digital converter according to claim 1, wherein said filtering means is a low-pass finite-impulse response filter.

3. The analog-to-digital converter according to claim 1, wherein the length L of said filtering means is related to the oversampling factor N by the relationship:

$$1 \leq L \leq N.$$

4. The analog-to-digital converter according to claim 1, wherein said quantizing means and said noise shaping means comprise a noise-shaping coder.

5. The analog-to-digital converter according to claim 1, wherein said addressing means is an R-bit binary counter, wherein:

$R = \log_2 N.$

6. The analog-to-digital converter according to claim 1, wherein said storing means is programmable such that different sets of said predetermined filter coefficient words can be stored, thereby achieving an arbitrarily chosen filter response.

7. The analog-to-digital converter according to claim 1, wherein said storing means is an N*B-bit read only memory (ROM), wherein B is the word width (in bits) of the predetermined filter coefficients.

8. The analog-to-digital converter according to claim 1, wherein said complementing means performs a binary complement function on the addressed filter coefficient word, such that the filtering means does not include any full multipliers.

9. An analog-to-digital converter comprising:
means for oversampling an analog input signal at a rate $N*f_S$, wherein $f_S$ is the output sampling frequency and N is the oversampling factor;
means for quantizing the sampled analog signal into a one-bit digital code, said quantizing means producing in-band and out-of-band quantization noise;
means for shaping the in-band quantization noise via a feedback network;
means for generating a plurality P of counter offset values;
means for filtering the out-of-band quantization noise from said one-bit digital code, said filtering means having a plurality P of overlapping filter paths, each of said P filter paths including:
means for storing P*N predetermined filter coefficient words;
means for addressing said storing means in response to the appropriate counter offset value at a rate corresponding to $N*f_S$;
means for selectively complementing the addressed filter coefficient word from said storing means in response to the one-bit output code from said quantizing means;
means for accumulating P*N selectively complemented filter coefficient words to provide a filtered output code at a rate $N*f_S$; and
means for decimating the filtered output code by N to provide a decimated filter code at a rate $f_S$; and
said analog-to-digital converter further comprising:
means for multiplexing the decimated filter codes from each of said P filter paths to provide a single digital output signal.

10. The analog-to-digital converter according to claim 9, wherein said filtering means is a decimating low-pass finite-impulse-response filter.

11. The analog-to-digital converter according to claim 9, wherein said filtering means has a frequency response given by:

$$H(\omega) = \left[ \frac{\sin(\omega LT/2)}{\sin(\omega T/2)} \right]^3$$

wherein L is the length of each of said P filtering means, and wherein T is the oversampling period defined as:

$T = 1/N*f_S.$

12. The analog-to-digital converter according to claim 9, wherein the length L of each of said P filtering means is related to the oversampling factor N by the relationship:

$(P-1)*N < L \leq P*N.$

13. The analog-to-digital converter according to claim 9, wherein the number of said plurality P of overlapping filter paths is between 2 and 10 overlapping filter paths.

14. The analog-to-digital converter according to claim 9, wherein each of said P overlapping filter paths are identical and overlapping in time, yet function independently to simultaneously provide P filtered output codes.

15. The analog-to-digital converter according to claim 9, wherein said quantizing means and said noise-shaping means comprise a noise-shaping coder.

16. The analog-to-digital converter according to claim 9, wherein each of said plurality of counter offset values has a value:

$N*(i-1),$
where $i = 1$ to P.

17. The analog-to-digital converter according to claim 9, wherein said addressing means is an R-bit binary counter, wherein:
$R = \log_2 (P*N).$ 18. The analog-to-digital converter according to claim 9, wherein said storing means is programmable such that different sets of said predetermined filter coefficient words can be stored, thereby achieving an arbitrarily chosen filter response.

19. The analog-to-digital converter according to claim 9, wherein said storing means is an P*N*B-bit read only memory (ROM), wherein B is the word width (in bits) of the predetermined filter coefficients.

20. The analog-to-digital converter according to claim 9, wherein said complementing means performs a binary complement function on the addressed filter coefficient word, such that the filtering means does not include any full multipliers.

21. The analog-to-digital converter according to claim 9, wherein said decimating means and said multiplexing means are interchanged such that the P filtered output codes are first multiplexed at a rate $N*f_S$, and then the single multiplexed output signal is decimated by N to provide the digital output signal at a rate $f_S$.

22. A method of converting an analog singal to a digital signal comprising the steps of:
oversampling an analog input singal at a rate $N*f_S$, wherein $f_S$ is the output sampling frequency and N is the oversampling factor;
quantizing the sampled analog signal into a one-bit digital code in a quantizing means, thereby producing in-band and out-of-band quantization noise;
shaping the in-band quantization noise via a feedback network;
filtering the out-of-band quantization noise from said one-bit digital code, said filtering step being performed simultanelusly in a plurality P of overlapping filter paths, said filtering step including the steps of:

pre-storing P*N predetermined filter coefficient words in a memory means;

generating a plurlity P of counter offset values, each having a value $N*(i-1)$, where $i=1$ to P;

addressing said memory means in response to the appropriate counter offset value, and retrieving said plurality P of said pre-stored coefficient words at a rate corresponding to $N*f_S$;

selectively complementing said plurality P retrieved filter coefficient words in response to the one-bit output code from said quantizing means, accumulating P*N selectively complemented filter coefficient words in each individual filter path to provide P filtered output codes at a rate $N*f_S$, and subsequently clearing each individual accumulation after accumulating P*N filter coefficient words;

decimating the P filtered output codes by N to provide a plurality P of decimated filter codes at a rate $f_S$; and multiplexing the plurality P of decimated filter codes from each of said P filter paths to provide a single digital output signal.

* * * * *